United States Patent
Abbott et al.

(10) Patent No.: US 6,681,362 B1
(45) Date of Patent: Jan. 20, 2004

(54) FORWARD ERROR CORRECTION FOR VIDEO SIGNALS

(75) Inventors: Liston Abbott, East Windsor, NJ (US); Krishnamurthy Jonnalagadda, Plainsboro, NJ (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 09/518,918

(22) Filed: Mar. 6, 2000

(51) Int. Cl.[7] ............................................. H03M 13/29
(52) U.S. Cl. ....................................................... 714/755
(58) Field of Search ......................................... 714/755

(56) References Cited

U.S. PATENT DOCUMENTS

| | | | | |
|---|---|---|---|---|
| 5,070,503 A | * | 12/1991 | Shikakura | 386/100 |
| 5,546,409 A | * | 8/1996 | Karasawa | 714/755 |
| 5,565,992 A | * | 10/1996 | Enari | 358/426.12 |
| 5,617,541 A | * | 4/1997 | Albanese et al. | 380/42 |
| 5,708,662 A | * | 1/1998 | Takashima | 370/496 |
| 5,973,625 A | * | 10/1999 | Nam | 341/50 |
| 5,978,958 A | * | 11/1999 | Tanaka et al. | 714/758 |
| 5,983,385 A | * | 11/1999 | Khayrallah et al. | 714/755 |
| 6,052,814 A | * | 4/2000 | Karasawa | 375/240.03 |
| 6,317,462 B1 | * | 11/2001 | Boyce | 375/240.27 |
| 6,499,128 B1 | * | 12/2002 | Gerlach et al. | 714/755 |

* cited by examiner

*Primary Examiner*—Stephen M. Baker
(74) *Attorney, Agent, or Firm*—William J. Burke

(57) ABSTRACT

Error correction in a data transmission system transmitting data as a sequence of data packets, each data packet containing a number of data bytes, employs parity bytes generated for each data byte in each data packet (e.g., row parity bytes) in conjunction with parity bytes for certain data bytes in predetermined data byte positions over a number of data packets (column data bytes). In a transmission arrangement, row parity bytes are generated and transmitted in a principal data channel along with the data packets, and column parity bytes are generated and transmitted in an ancillary data channel. In a receiver arrangement, row parity bytes are decoded in a principal data channel along with the data packets, and column parity bytes are decoded in an ancillary data channel and are employed to correct the data bytes in the principal data channel. A transmission system includes a transmission arrangement and a receiver arrangement communicating via a transmission medium.

30 Claims, 5 Drawing Sheets

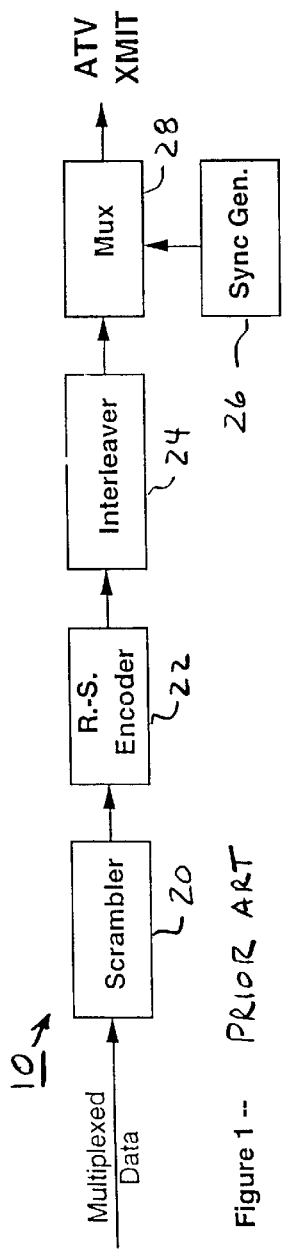
Figure 1 -- PRIOR ART
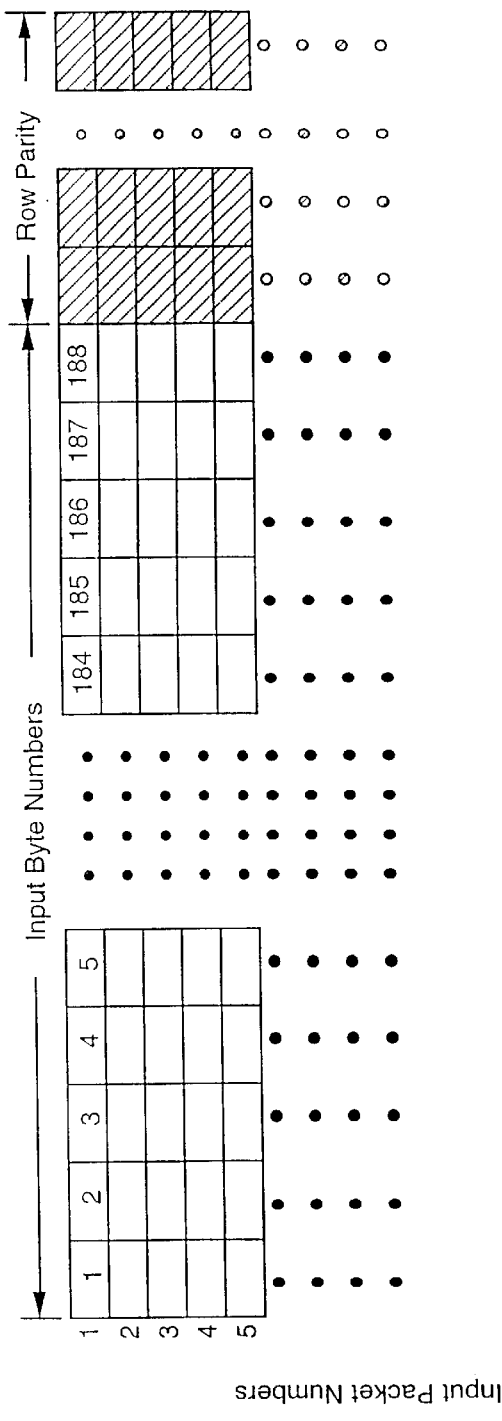
Figure 2 -- PRIOR ART

FORWARD ERROR CORRECTION FOR VIDEO SIGNALS

The present invention relates to correction of errors in signals and, in particular, to correction of errors in signals utilizing transmitted error correction information.

When signals are transmitted from a source location to a receiver location, error is introduced into the signals due to many conditions, among which are interference signals, reflections and ghost signals, noise signals and the like, as well as by imperfections in the transmitting and/or receiving apparatus. Such errors occur in video signals as well as in non-video related data signals. Some level of error may be tolerable to a user or viewer of the error-laden received signal, as with the case of occasional "snow" or "confetti" in an analog television signal, for example, because the analog television signal tends to degrade "gracefully" in the presence of noise and interference, principally due to the viewer's tolerance of the undesired effect in the picture.

In digital systems, on the other hand, the effects of such noise and interference on a digital signal transmission may be more pronounced, e.g., a sudden complete corruption of digital data or loss of picture, despite the generally superior resistance of digital systems to the effects of noise and interference. A prominent digital television system is the advanced television (ATV) broadcasting protocol established by the Advanced Television Systems Committee (ATSC) in the United States. (See, e.g., "Guide to the Use of the ATSC Digital Television Standard" available via the Internet from the ATSC at www.atsc.org/Standards/stan_rps.html and ATV Standard A54 dated Oct. 4, 1995 also available via the Internet from the ATSC at www.atsc.org/Standards/A54/ and from the United States Federal Communication Commission at www.fcc.gov/Bureaus/Engineering_Technology/Documents/atsc/a54/). The ATSC ATV protocol includes a forward error correction protocol designed to provide a level of error correction deemed adequate for normal viewing of broadcast television program material. For example, the expected bit error rate for broadcast signals of about $10^{-4}$ is correctable to about $10^{-8}$ by utilizing the error correction system specified by the ATSC ATV protocol.

The ATSC ATV protocol provides an ancillary data channel that may be used to transmit data which may or may not be related to the video and data contained in the principal broadcast signal or principal data channel. Because the ancillary data channel is interleaved with the principal data channel, the capacity of the ancillary data channel varies in inverse relation to the content of the principal data channel. Where the data content of the principal data channel is low such as when there is substantial redundancy in the video content thereof, the number of digital bits required to transmit such video data content is relatively lower, thereby permitting the data content of the ancillary data channel to increase commensurately. Conversely, where the data content of the principal data channel is high such as when there is substantial change and little redundancy in the video content thereof, the number of digital bits required to transmit such video data content is relatively higher, thereby reducing the possible data content of the ancillary data channel commensurately.

While the specified ATSC ATV error correction protocol may be satisfactory for viewing of broadcast video programming, it is not satisfactory for certain other applications requiring much lower bit error rates. Such applications include, for example, high-quality video data storage and retransmission, computer data transmission, and secure data transactions, which typically require bit error rates at a level of about $10^{-12}$, which is comparable to the bit error rate obtainable for data read from a CD-ROM. To be advantageous, transmission systems providing such reduced error rates should be compatible with the ATSC transmission specification so that standard receivers capable of receiving and processing the standard ATSC-specified data transmissions are not incapacitated by the presence of an improved error correction signal contained in the ancillary data channel and so that receivers intended for receiving the improved error correction signal contained in the auxiliary data channel will properly receive and process the ATSC standard error correction signal.

Accordingly, there is a need for an error correction arrangement providing improved error correction when received by suitably equipped receivers, without unduly affecting the operation of conventional ATSC standard receivers.

To this end, the error correction arrangement of the present invention comprises an information transmission system comprising a transmitting arrangement encoding the information, a receiving arrangement decoding the information, and a transmission system coupling the transmission arrangement to the receiving arrangement for coupling encoded information thereto.

In accordance with the invention, a transmitting arrangement comprises a first encoder producing first data packets, each first data packet including data bytes representative of the information and first error-correction bytes relating to the data bytes thereof, a second encoder producing at least one additional data packet including second error-correction bytes relating to predetermined data bytes of a predetermined number of the first data packets produced by the first encoder, and a multiplexer combining the first data packets produced by the first encoder and the at least one additional data packet produced by the second encoder.

In accordance with the invention, a receiving arrangement comprises a separator for separating the first data packets from the at least one additional data packet, a first decoder responsive to the first data packets to produce uncorrected data bytes and corrected data bytes thereof responsive to the first error-correction bytes thereof, a second decoder responsive to the second data packets to produce corrected predetermined data bytes representative of the predetermined data bytes responsive to the second error-correction bytes of the second data packets, and a corrector replacing selected ones of the uncorrected data bytes and corrected data bytes with selected ones of the corrected predetermined data bytes to produce the information.

In a method of encoding and decoding information according to the invention encoding the information comprises:

producing first data packets, each first data packet including data bytes representative of the information and first error-correction bytes relating to the data bytes thereof, producing at least one additional data packet including second error-correction bytes relating to predetermined data bytes of a predetermined number of the first data packets, and combining the first data packets and the at least one additional data packet; and decoding the information comprises:

separating the first data packets from the at least one additional data packet, responsive to the first data packets, producing uncorrected data bytes and corrected data bytes thereof responsive to the first error-correction bytes thereof, responsive to the second data packets, producing corrected predetermined data bytes representative of the predetermined data bytes responsive to the second error-correction bytes of the second data packets, and replacing selected ones of the uncorrected data bytes and corrected data bytes with selected ones of the corrected predetermined data bytes to produce the information.

BRIEF DESCRIPTION OF THE DRAWING

The detailed description of the preferred embodiments of the present invention will be more easily and better understood when read in conjunction with the FIGURES of the Drawing which include:

FIG. 1 is a schematic block diagram of the relevant portion of a conventional ATSC transmission system;

FIG. 2 is a diagram illustrating a sequence of digital data including ATSC standard error correction;

Figure 3:
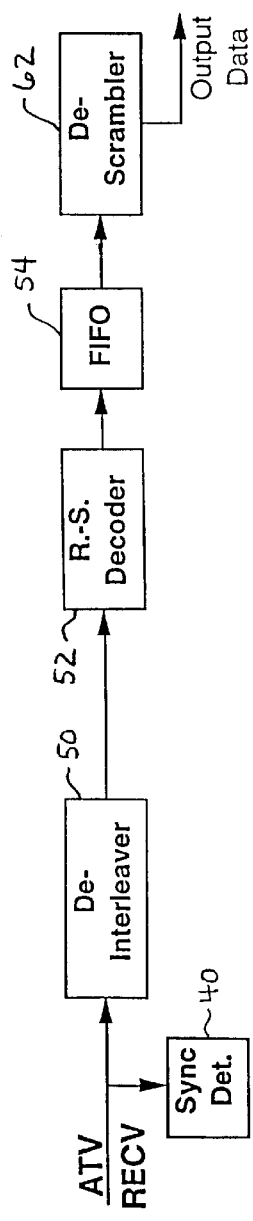
FIG. 3 is a schematic block diagram of the relevant portion of a conventional ATSC receiving system.

In the Drawing, where an element or feature is shown in more than one drawing figure, the same alphanumeric designation may be used to designate such element or feature in each figure, and where a closely related or modified element is shown in a figure, the same alphanumerical designation primed may be used to designate the modified element or feature.

DESCRIPTION OF THE PREFERRED EMBODIMENT

FIG. 1 is a schematic block diagram of the relevant portion of a conventional ATSC transmission system 10 which receives multiplexed digitized data, i.e. a sequence of digital data words representative of a video image or video data, or of audio data or other data bytes, for example, that is to be transmitted from a source location to a reception location via a transmission medium, and performs standard ATSC forward error correction. Data scrambler 20 receives the incoming multiplexed digital data and scrambles or randomizes the data in accordance with the ATSC specified data scrambling standard. The scrambled multiplexed data is in the form of data packets each including a given number of digital data bytes of given length. Standard ATSC forward error correction information including a derived block of digital parity bytes is generated for each data packet of data bytes by Reed-Solomon encoder 22 and is appended to each data packet of data bytes.

Because the appended Reed-Solomon parity bytes are computed separately and independently for each incoming data packet and are appended specifically to the data packet to which they pertain, the appended Reed-Solomon parity bytes may be considered as additional "row" elements, where the incoming packetized digital data is considered as being structured or formatted in a "rows" format, as is illustrated in the diagram of FIG. 2, for example, for several packets of packetized digital data including error correction bytes. Therein, the lines of dots and circles are "ellipses" indicating omission of intervening columns and subsequent rows, as the case may be, of data bytes and data packets.

Each row is made up of the original sequence of data bytes contained in a particular data packet followed by the sequence of row parity bytes produced by Reed-Solomon encoder 22. Interleaver 24 generates the columns of data packets by reordering the sequence of input bytes into a sequence in which the sequence of data bytes of each group of N input data packets are output consecutively, followed by the sequence of Reed-Solomon parity bytes produced for the data bytes to which they pertain. The Reed-Solomon parity bytes of each row are transmitted along with the original data packets and are utilized in the error detection and correction portion of a standard ATSC receiver in a complementary manner to detect and correct errors, if any, in the received data packets.

Subsequent to the generation and appending of error correction information by Reed-Solomon encoder 22 and interleaving of the data bytes and the parity bytes by interleaver 24, data synchronization signals generated by synchronization generator 26 are inserted into the sequence of digital data packets by multiplexer 28 and the multiplexed packetized data ATV XMIT is transmitted by a suitable transmitter over a transmission medium.

FIG. 3 is a schematic block diagram of the relevant portion of a conventional ATSC receiving system 40. Received ATV digital data ATV RECV of a sequence of digital data packets are applied to synchronization signal (sync) detector 42 which detects the synchronization and timing signals therein for controlling the operation of the decoding processes of receiver 40 and to de-interleaver 50 and Reed-Solomon decoder 52 which process the received data to generate a signal that indicates the presence of any bytes that it is unable to detect, i.e. any bytes containing an error as determined by a deviation from the standard ATSC encoding protocol. Complete information concerning the ATSC ATV is publicly available, e.g., a "Guide to the Use of the ATSC Digital Television Standard" is available via the Internet from the ATSC at http://www.atsc.org/Standards/stan_rps.html and the ATV Standard A54 dated Oct. 4, 1995 is also available via the Internet from the ATSC at www.atsc.org/Standards/A54/ and from the U.S. FCC at www.fcc.gov/Bureaus/Engineering_Technology/Documents/atsc/a54/.

Figure 4:
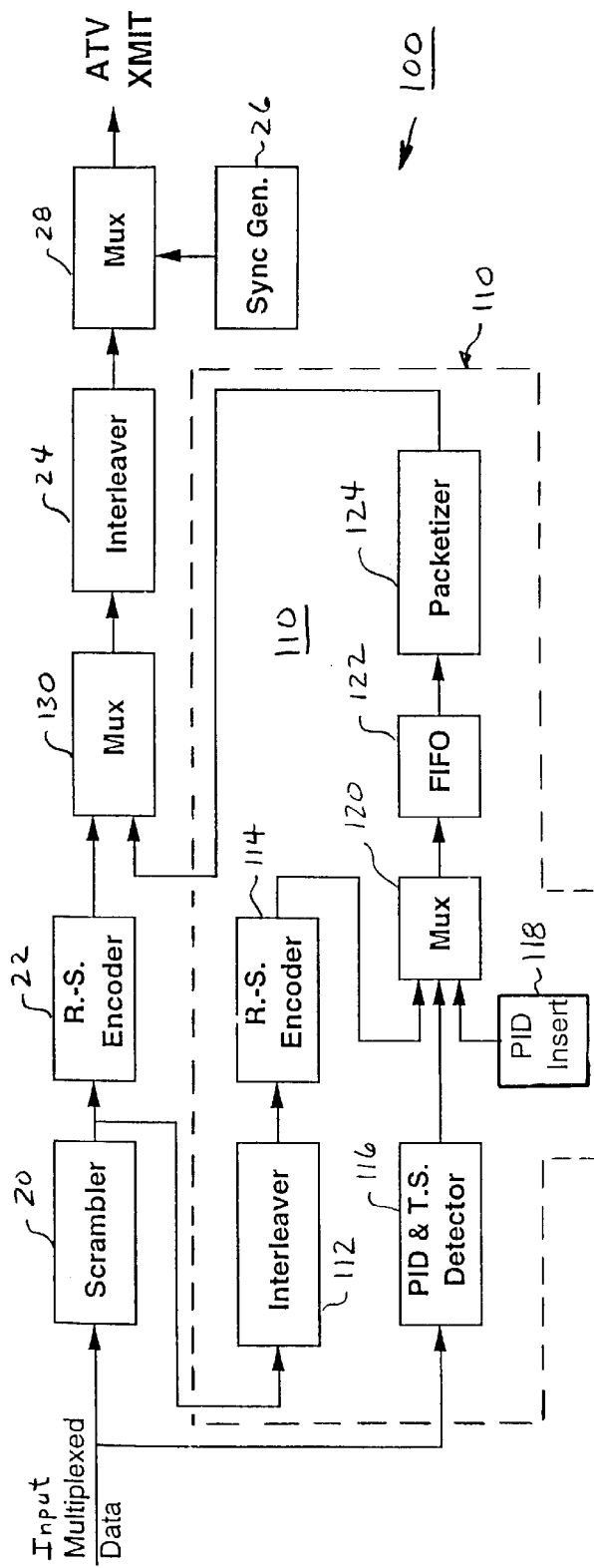
FIG. 4 is a schematic block diagram of an exemplary embodiment of a transmission arrangement including improved error correction in accordance with the present invention.

FIG. 4 is a schematic block diagram of an exemplary embodiment of a transmission arrangement 100 including improved error correction in accordance with the present invention. The multiplexed input data words are processed by the standard ATSC randomizer or scrambler 20, Reed-Solomon encoder 22, interleaver 24, sync generator 26 and multiplexer 28 as described above in relation to FIGS. 1 and 2 to produce, absent forward error correction encoder 110 and multiplexer 130, a standard ATSC ATV packetized data output including a sequence of data bytes followed by standard ATSC error correction parity bytes. In addition, further error correction parity bytes produced by forward error correction (FEC) encoder 110 are multiplexed together with the standard error correction data produced by encoder 22 in multiplexer 130 to produced an enhanced error correction wherein the capacity of the ancillary data channel that carries the error correction parity bytes is more fully utilized.

The foregoing is accomplished by including additional error correction parity bytes produced by FEC encoder 110 in the ancillary data channel to enhance the quality of the data reception in receivers equipped suitably to detect and process such additional error correction parity bytes, without affecting the operation of standard ATSC receivers that detect and operate on only the specified ATSC standard error correction parity bytes and ignore the additional error correction parity bytes in accordance with the present invention. This is because the standard ATSC receiver only recognizes those error correction parity bytes as specified in the applicable ATSC transmission standard protocol.

Figure 5:
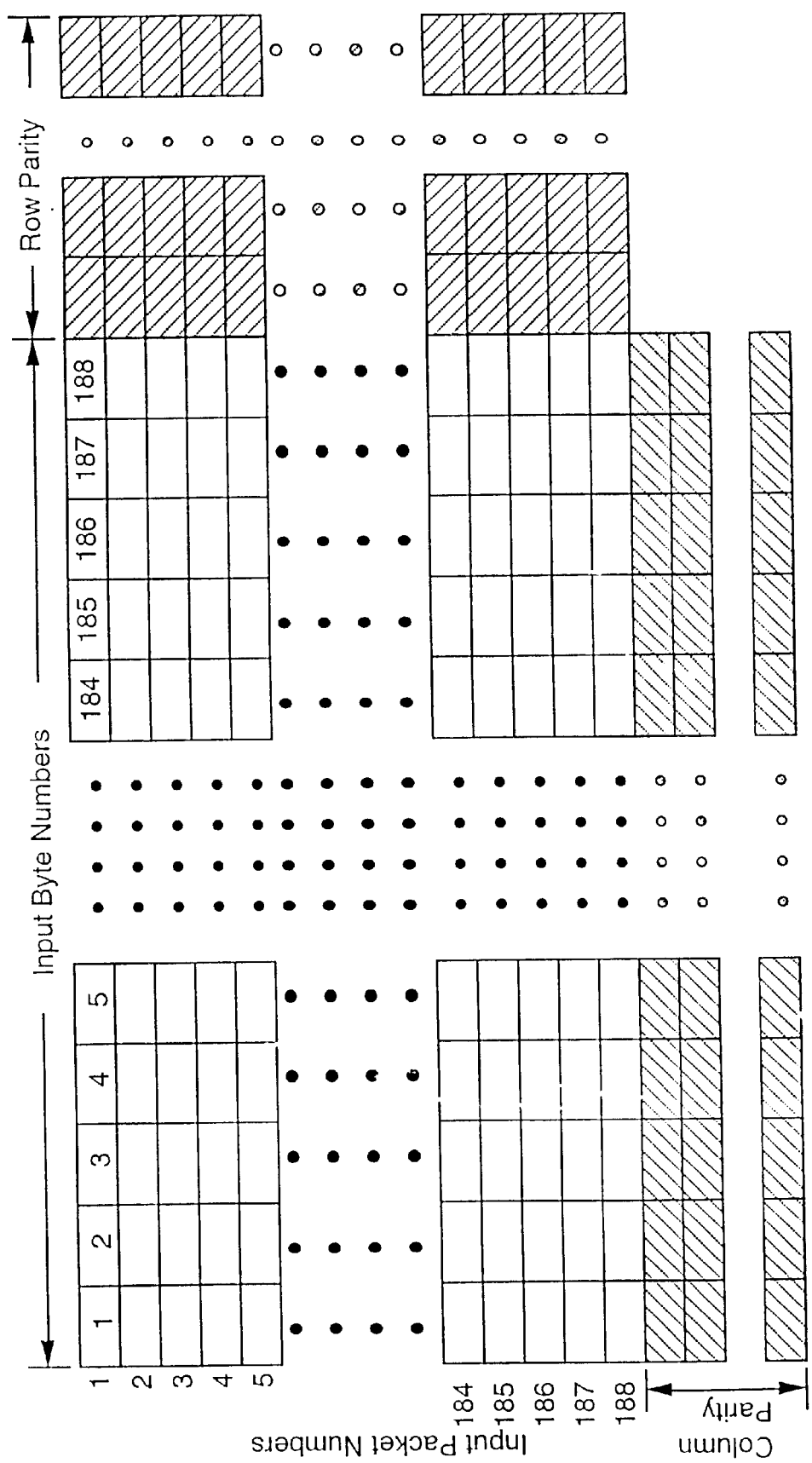
FIG. 5 is a diagram illustrating a sequence of an exemplary frame of digital data packets including error correction in accordance with the present invention.

The scrambled or randomized incoming multiplexed digital data is also applied to an interleaver 112 and Reed-Solomon encoder 114 that together produce additional error correction parity bytes for enhancing the error correction ultimately obtained. FIG. 5 is a diagram illustrating a sequence of an exemplary frame of digital data packets including additional forward error correction in accordance with the present invention as produced, for example, by the transmission arrangement of FIG. 4.

As described above, because the appended Reed-Solomon parity bytes are computed separately and independently for each incoming data packet and are appended specifically to the data packet to which they pertain, the appended Reed-Solomon parity bytes may be considered as additional "row" elements in a data packet comprising a group of N data bytes and appended parity bytes in a "row" of packetized data. Where the data packets of each data packet "row" are supplemented by additional parity bytes associated with other groups of data bytes, for example, "columns" of data bytes, a "product coding" system may be produced. In a "product coding" system, incoming packetized digital data is restructured or formatted into a "rows" and "columns" format, as is illustrated in the diagram of FIG. 5, for example, for a frame of packetized digital data including error correction parity bytes. Therein, the dots and circles represent "ellipses" indicating omission of intervening rows of data packets and columns of data bytes, as the case may be.

Each row is made up of the original sequence of data bytes contained in a particular data packet followed by the sequence of row parity bytes produced by Reed-Solomon encoder 22. Interleaver 112 generates the columns of data packets by reordering the sequence of input data bytes into a sequence in which the first data byte of each group of N input data packets are output consecutively, followed by the second data byte of each of the N input data packets, followed by the third data byte of each of the N input data packets, and so forth until all the data bytes of all of the group of N input data packets have been produced in sequence. In addition, column parity bytes are produced for each column of data bytes by Reed-Solomon encoder 114 and are appended at the bottom of the particular column to which they pertain. The Reed-Solomon parity bytes of each row and of each column are combined via multiplexers 120 and 130 and are transmitted along with the original data packets to be utilized in the error detection and correction portion of the receiver arrangement in a complementary manner to detect and correct errors, if any, in the received data packets. Thus, the efficacy of the overall error correction is a "product" of both the "row" error correction capability and of the "column" error correction capability.

In addition, the input multiplexed data is applied to detector 116 which detects the packet identification (PID) and time stamp (TS) information therefrom and applies same to multiplexer 120 which selectively passes the PID and TS information to its output responsive to a PID insertion control signal 118, as well as all of the column parity bytes. The forward error correction column parity bytes, PID and TS signals are buffered in first-in first-out (FIFO) memory 122 and are re-packetized with a unique new packet identification (PID) by packetizer 124 into a complete ancillary data stream or channel that is multiplexed with the standard ATSC ATV data stream or channel by multiplexer 130. It is noted that the data rate of this ancillary data channel is substantially lower than is the data rate of the principal data channel because only a small subset of the principal data, e.g., the PID and TS information, and the column parity byte data, are transmitted therein.

Subsequent to the generation and appending of row error correction information by Reed-Solomon encoder 22 and interleaver 24, and to the multiplexing of the ancillary data channel including column error correction information by multiplexer 130, data synchronization signals generated by synchronization generator 26 are inserted into the sequence of digital data packets by multiplexer 28 and the multiplexed packetized data ATV XMIT is transmitted by a suitable transmitter.

Figure 6:
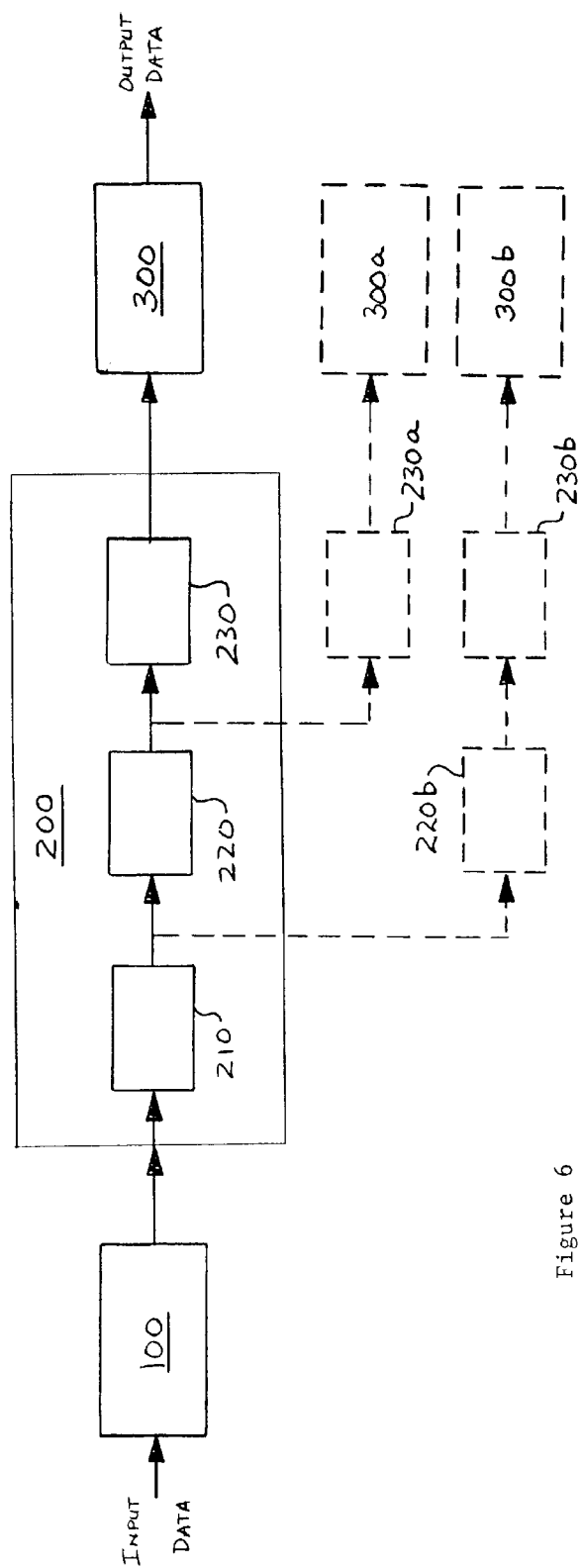
FIG. 6 is a schematic block diagram of an exemplary embodiment of a transmission system including a transmission arrangement and at least one receiver arrangement each including improved error correction in accordance with the present invention.

FIG. 6 is a schematic block diagram of an exemplary information transmission system 200 including a transmission arrangement 100 and at least one receiver arrangement 300 each including improved error correction in accordance with the present invention. Transmission arrangement 100 is, for example, as described above in relation to FIG. 4, producing packetized digital data including enhanced forward error correction information as illustrated in FIG. 5. Transmission system 200 includes transmitter 210, transmission medium 220 and receiver 230. Transmitter 210 includes, for example, a modem, cable system head end, radio transmitter, television transmitter, laser or other optical transmitter, radiating antenna, space satellite, or other transmitter of information. Transmission medium 220 includes, for example, a cable, LAN, optical fiber, broadcast electromagnetic radiation, broadcast light, air, vacuum or other medium, and may include one or more of the foregoing, as well as repeaters, intermediate amplifiers or re-transmitters, space satellites, and the like. Receiver 330 is of complementary kind to transmitter 210 in view of transmission medium 220, and may include, for example, a modem, cable system converter, radio receiver, television receiver, photodetector or other optical receiver, receiving antenna, space satellite, or other receiver of information signals. As illustrated in phantom in FIG. 6, information may be transmitted in transmission system 200 through transmission medium 220 to one or plural receivers 230, 230a, as well as through one or plural transmission media 220, 220b to one or plural receivers 230, 230a, 230b, each of which receivers is coupled to a respective receiving apparatus 300, 300a, 300b.

Figure 7:
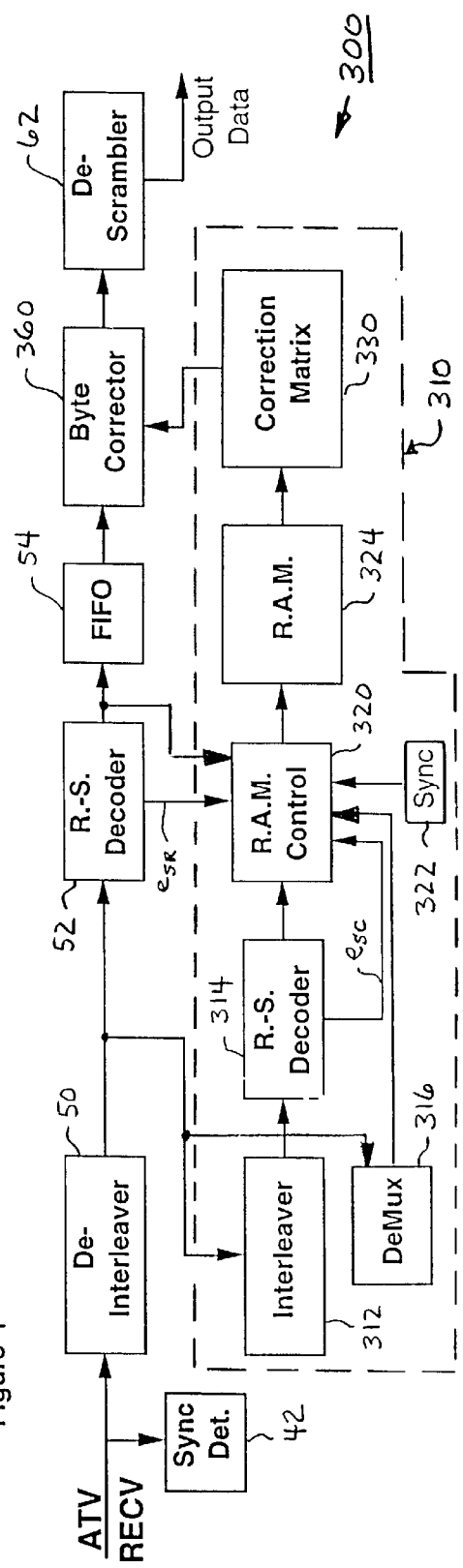
FIG. 7 is a schematic block diagram of an exemplary embodiment of a receiver arrangement including improved error correction in accordance with the present invention.

FIG. 7 is a schematic block diagram of an exemplary embodiment of a receiver arrangement 300 including improved error correction in accordance with the present invention. Received ATV digital data ATV RECV of a sequence of digital data packets are applied to synchronization signal (sync) detector 42 which detects the synchronization and timing signals therein for controlling the operation of the decoding processes of receiver arrangement 300 and to de-interleaver 50 and Reed-Solomon decoder 52 which process the received data to generate a signal that indicates the presence of any erroneous data bytes that it is unable to correct, i.e. any bytes containing an error as described above. The incoming ATV RECV data is also applied to FEC decoder 310 which operates on the column parity bytes for correcting errors in data bytes of the received data packets beyond the errors in data bytes correctable responsive to the standard ATSC error correction utilizing only the row parity bytes.

De-interleaved incoming data packets applied to FEC decoder 310 are applied to a column parity decoder including interleaver 312 and Reed-Solomon decoder 314 which generates corrected data bytes and uncorrected-error information therefrom and to demultiplexer 316 which parses the incoming data packets to determine when an incoming data packet represents a packet of column correction parity bytes of the ancillary data channel, such as by identifying the unique PID associated therewith. Random access memory (RAM) control 320 receives from de-multiplexer 316 the error correction timing information contained in the ancillary data channel and corrected data bytes and an error indication $e_{SR}$ indicative of a row parity error from row Reed-Solomon decoder 52 and corrected data bytes, and a further error indication $e_{SC}$ indicative of a column parity error from column FEC decoder 314.

Responsive thereto, RAM control 320 determines when an uncorrected error detected by the row parity decoder 52 can be corrected utilizing the column parity byte provided by the column parity decoder 314, for example, when the row parity byte for a particular data byte does not indicate or cannot correct an error, but the column parity byte corresponding thereto indicates presence of an error. In response thereto, RAM control 320 stores in RAM 324 corrective information derived from the column parity byte, which corrective information is stored in a memory location in RAM 324 corresponding to the location of that particular data byte in the frame of data byte packets of which the particular data byte is part and by the PID and/or time stamp thereof. Corrective information selectively retrieved from RAM 324 responsive to the control of RAM control 320 is stored in correction matrix 330 and determines if and how the output data bytes from FIFO memory 54 are corrected in byte corrector 360.

The output data of row decoder 52 is appropriately buffered by FIFO memory 54 so as to be applied to byte corrector 360 coincident in time with the output of correction matrix 330. Output data bytes from FIFO memory 54 are corrected in byte corrector 360 by operation of the information of the data from correction matrix 330 thereon. While such operation may include computation, such as interpolation, it may simple involve the substitution corrective data bytes from correction matrix 330 for the decoded data bytes from decoder 52 and FIFO memory 54. The resulting data bytes produced at the output of byte corrector 360 are de-scrambled or de-randomized by de-scrambler 62 and are provided as output data bytes therefrom as the system output, for utilization in an appropriate utilization device, such as a video display, computer, data processor or other utilization device.

Many of the functions described above are available as standard integrated circuits available commercially from one or more sources. For example, data randomizer or scrambler 20 may be implemented with 8-bit parallel output serial shift registers type SN54164, SN54LS164, SN74164, or SN74LS164, Reed-Solomon encoders 22, 114 and decoders 52, 314 may be implemented with type AHA-4010 available from Advanced Hardware Architectures located in Moscow, Id. multiplexers 28, 120, 130 may be implemented by type 74LS244 multiplexer, detector 116 by type CD4514 available from Texas Instruments located in Dallas, Tex. and FIFO memory by type IDT72132 memory available from Integrated Digital Technology located in Santa Clara, Calif.

Figure 8:
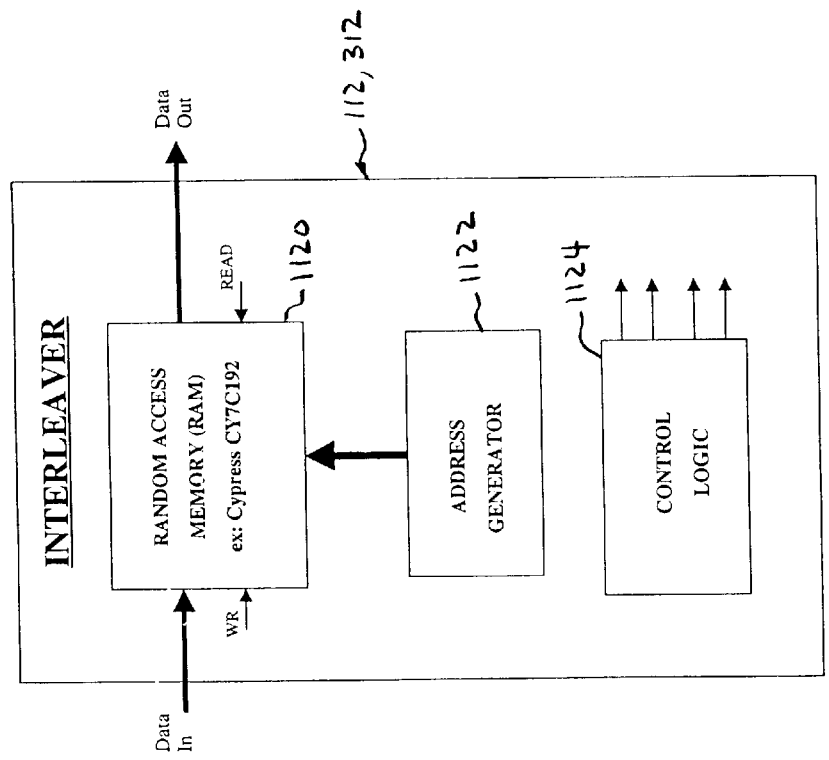

FIG. 8 is a schematic block diagram of an exemplary interleaver useful as an interleaver 24, 112, 312 of the embodiments of FIGS. 4 and 7. Such interleaver is for transforming a matrix of number N rows by number B columns of bytes of data (Data In) by writing such data into memory in row order and reading it out from such memory in column order (Data Out). Therein, data bytes to be stored, such as data bytes in one or more data packets, are applied to RAM 1120 and are written therein under control of write enable WR in locations addressed by address generator 1122 and are produced from RAM 1120 under control of read enable READ from the location addressed by address generator 1122, all under the control of control logic 1124. An exemplary circuit suitable for RAM 1120 is type CY7C192 available from Cypress Semiconductor located in San Jose, Calif.

Figure 9:
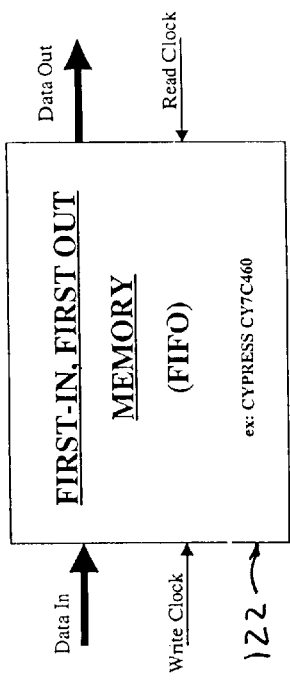
FIGS. 8–10 are schematic block diagrams of various functions of the embodiments of FIGS. 4 and 7.

FIG. 9 is a schematic block diagram of an exemplary FIFO memory useful as FIFO memory 122 and 54 of FIGS. 4 and 7. Such FIFO memory is useful for providing timing and/or data rate changes in streams of digital data bytes being transferred from one circuit to another. Incoming data (Data In) is read into memory locations of FIFO memory 122 serially responsive to a signal Write Clock compatible with the timing and data rate of the source of the incoming data bytes, and is produced at an output thereof with timing and at a data rate determined by the timing and frequency of the signal Read Clock. An exemplary circuit suitable for FIFO memory 122 is type CY7C460 available from Cypress Semiconductor.

Figure 10:
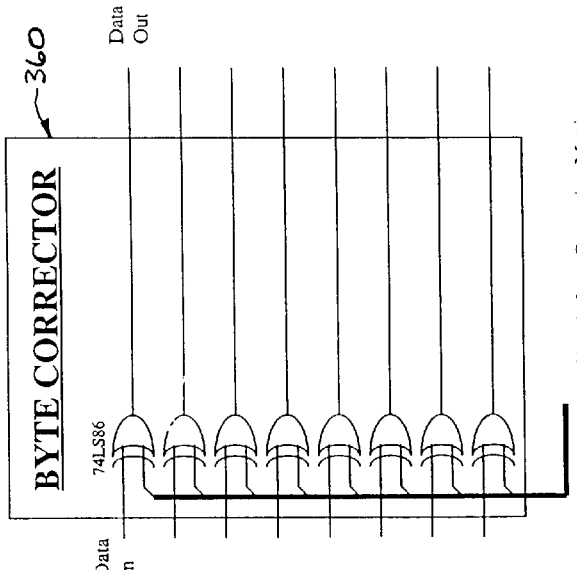

FIG. 10 is a schematic block diagram of an exemplary byte corrector useful for byte corrector 360 in the embodiment of FIG. 7. Byte corrector 360 is an 8-bit parallel exclusive OR circuit, such as a type 74LS86, receiving 8-bit incoming data bytes (Data In) on one input of each exclusive OR gate thereof and providing corrected data bytes at the 8-bit output (Data Out) thereof, by inverting the bits of each data byte that are determined to be in error. Correction of the input data bytes is provided by inverting the digital value of any one or more of the bits thereof responsive to an 8-bit data inversion signal produced from correction matrix 330.

While the present invention has been described in terms of the foregoing exemplary embodiments, variations within the scope and spirit of the present invention as defined by the claims following will be apparent to those skilled in the art. For example, while the present invention is described in relation to the ATSC ATV transmission protocol, it is not limited to such protocol or to similar protocols. It may be employed with respect to video data, whether in the ATV or other protocol and to non-video data in any protocol that allows, will tolerate or can be made to tolerate the additional bytes as described herein.

Moreover, the numbers of bits in each byte, the number of data bytes in each data packet, the number of data packets in each group of data packets for which column parity bytes are generated, may each be varied as is convenient and necessary to a particular application and bit error rate specification, especially where such number is not constrained by a particular standard, such as the ATSC ATV standard and error correction protocol.

What is claimed is:

1. An information transmission system comprising:
   a transmitting arrangement encoding the information;
   a receiving arrangement decoding the information; and a transmission system coupling said transmission arrangement to said receiving arrangement for coupling encoded information thereto;

wherein said transmitting arrangement comprises:

a first encoder producing first data packets, each first data packet including data bytes representative of the information and first error-correction bytes relating to the data bytes thereof, a second encoder producing at least one additional data packet including second error-correction bytes relating to predetermined data bytes of a predetermined number of the first data packets produced by said first encoder, and a multiplexer combining the first data packets produced by said first encoder and the at least one additional data packet produced by said second encoder; and wherein said receiving arrangement comprises:

a separator for separating the first data packets from the at least one additional data packet, a first decoder responsive to the first data packets to produce uncorrected data bytes and corrected data bytes thereof responsive to the first error-correction bytes thereof, a second decoder responsive to the at least one additional data packet to produce corrected predetermined data bytes representative of the predetermined data bytes responsive to the second error-correction bytes of the at least one additional data packet, and a corrector replacing selected ones of the uncorrected data bytes and corrected data bytes with selected ones of the corrected predetermined data bytes to produce the information.

2. The transmission system of claim 1 wherein said first encoder includes a Reed-Solomon encoder.

3. The transmission system of claim 1 wherein said second decoder comprises a Reed-Solomon decoder for producing the second error-correction bytes from the at least one additional data packet.

4. The transmission system of claim 1 wherein said first decoder further comprises a Reed-Solomon decoder.

5. The transmission system of claim 1 wherein said second encoder comprises an interleaver for reordering the sequence of data bytes of the predetermined number of the first data packets, and a Reed-Solomon encoder producing the second error-correction bytes from the reordered sequence of data bytes.

6. The transmission system of claim 5 wherein said second encoder further comprises a packetizer coupled to said Reed-Solomon encoder for producing the at least one additional data packet.

7. The transmission system of claim 6 wherein said second encoder further comprises a multiplexer interposed between said Reed-Solomon encoder and said packetizer, wherein said multiplexer combines at least one of packet identification and time stamp information relating to the first data packets with the second error-correction bytes.

8. The transmission system of claim 1 wherein said second decoder comprises a control circuit responsive to said first decoder and to the second error-correction bytes.

9. The transmission system of claim 8 wherein said second decoder further comprises a memory coupled to said control circuit and storing corrected predetermined data bytes derived from said second error-correction bytes.

10. The transmission system of claim 9 wherein said control circuit selects the predetermined data bytes stored in said memory.

11. The transmission system of claim 9 wherein said control circuit applies the selected ones of the predetermined corrected data bytes to said corrector.

12. A transmission arrangement for packetized information comprising:

a first encoder producing first data packets, each first data packet including data bytes and first error-correction bytes relating to the data bytes thereof;

a second encoder producing at least one additional data packet including second error-correction bytes relating to predetermined data bytes of a predetermined number of the first data packets produced by said first encoder; and a multiplexer combining the first data packets produced by said first encoder and the at least one additional data packet produced by said second encoder.

13. The transmission arrangement of claim 12 wherein said second encoder comprises an interleaver for reordering the sequence of data bytes of the predetermined number of the first data packets, and a Reed-Solomon encoder producing the second error-correction bytes from the reordered sequence of data bytes.

14. The transmission arrangement of claim 12 wherein said first encoder includes a Reed-Solomon encoder.

15. A transmission arrangement for packetized information comprising:

a first encoder producing first data packets, each first data packet including data bytes and first error-correction bytes relating to the data bytes thereof;

a second encoder producing at least one additional data packet including second error-correction bytes relating to predetermined data bytes of a predetermined number of the first data packets produced by said first encoder, said second encoder comprising an interleaver for reordering the sequence of data bytes of the predetermined number of the first data packets, and a Reed-Solomon encoder producing the second error-correction bytes from the reordered sequence of data bytes; and a multiplexer combining the first data packets produced by said first encoder and the at least one additional data packet produced by said second encoder, wherein said second encoder further comprises a packetizer coupled to said Reed-Solomon encoder for producing the at least one additional data packet.

16. The transmission arrangement of claim 14 wherein said second encoder further comprises a multiplexer interposed between said Reed-Solomon encoder and said packetizer, wherein said multiplexer combines at least one of packet identification and time stamp information relating to the first data packets with the second error-correction bytes.

17. A receiving arrangement for packetized information comprising:

a separator for separating first data packets containing data bytes and first error-correction bytes relating thereto from second data packets containing second error-correction bytes relating to predetermined data bytes of a predetermined number of the first data packets;

a first decoder responsive to the first data packets to produce corrected and uncorrected data bytes thereof responsive to the first error-correction bytes thereof;

a second decoder responsive to at least the second error-correction bytes of the second data packets to produce corrected predetermined data bytes of the predetermined number of the first data packets; and a corrector replacing selected ones of the corrected and uncorrected data bytes with selected corresponding ones of the corrected predetermined data bytes.

18. The receiving arrangement of claim 17 wherein said second decoder comprises a Reed-Solomon decoder for producing the second error-correction bytes from the second data packets.

19. The receiving arrangement of claim 17 wherein said first decoder further comprises a Reed-Solomon decoder.

20. The receiving arrangement of claim 17 wherein said second decoder comprises a control circuit responsive to said first decoder and to the second error-correction bytes.

21. The receiving arrangement of claim 20 wherein said second decoder further comprises a memory coupled to said control circuit and storing corrected predetermined data bytes derived from said second error-correction bytes.

22. The receiving arrangement of claim 21 wherein said control circuit selects the predetermined data bytes stored in said memory.

23. The receiving arrangement of claim 21 wherein said control circuit applies the selected ones of the predetermined corrected data bytes to said corrector.

24. A method of encoding and decoding information comprising:
wherein encoding the information comprises:
producing first data packets, each first data packet including data bytes representative of the information and first error-correction bytes relating to the data bytes thereof,
producing at least one additional data packet including second error-correction bytes relating to predetermined data bytes of a predetermined number of the first data packets, and
combining the first data packets and the at least one additional data packet; and
wherein decoding the information comprises:
separating the first data packets from the at least one additional data packet,
responsive to the first data packets, producing uncorrected data bytes and corrected data bytes thereof responsive to the first error-correction bytes thereof,
responsive to the at least one additional data packets, producing corrected predetermined data bytes representative of the predetermined data bytes responsive to the second error-correction bytes of the at least one additional data packets, and
replacing selected ones of the uncorrected data bytes and corrected data bytes with selected ones of the corrected predetermined data bytes to produce the information.

25. The method of claim 24 wherein said producing corrected predetermined data bytes includes producing the second error-correction bytes from the at least additional data packet.

26. The method of claim 24 wherein said producing corrected predetermined data bytes includes storing corrected predetermined data bytes derived from said second error-correction bytes.

27. The method of claim 24 wherein at least one of (a) said producing first data packets and (b) said producing uncorrected data bytes and corrected data bytes includes one of Reed-Solomon encoding and Reed-Solomon decoding.

28. The method of claim 24 wherein said producing at least one additional data packet includes reordering the sequence of data bytes of the predetermined number of the first data packets, and producing the second error-correction bytes from the reordered sequence of data bytes.

29. The method of claim 28 wherein said producing at least one additional data packet further includes packetizing the second error-correction bytes.

30. The method of claim 28 wherein said producing at least one additional data packet further includes multiplexing at least one of packet identification and time stamp information relating to the first data packets with the second error-correction bytes.

* * * * *